United States Patent [19]
Okahisa et al.

[11] Patent Number: 5,970,314
[45] Date of Patent: Oct. 19, 1999

[54] PROCESS FOR VAPOR PHASE EPITAXY OF COMPOUND SEMICONDUCTOR

[75] Inventors: Takuji Okahisa; Mitsuru Shimazu; Masato Matsushima; Yoshiki Miura; Kensaku Motoki, all of Itami; Hisashi Seki, Hachioji; Akinori Koukitu, Fucyu, all of Japan

[73] Assignee: Sumitomo Electric Industries, Ltd., Osaka, Japan

[21] Appl. No.: 08/823,237

[22] Filed: Mar. 24, 1997

[30] Foreign Application Priority Data

Mar. 25, 1996 [JP] Japan .................................. 8-067762
Mar. 21, 1997 [JP] Japan .................................. 9-087570

[51] Int. Cl.$^6$ .......................... H01L 21/00; H01L 21/20; H01L 21/36; C30B 25/14
[52] U.S. Cl. .............................. 438/47; 438/503; 438/507
[58] Field of Search .................................. 438/31, 46, 47, 438/503, 507

[56] References Cited

U.S. PATENT DOCUMENTS

| | | | |
|---|---|---|---|
| 4,987,088 | 1/1991 | Yamazaki et al. | 427/53.1 |
| 5,012,158 | 4/1991 | Nakatani et al. | 315/111.21 |
| 5,334,277 | 8/1994 | Nakamura | 117/102 |
| 5,602,418 | 2/1997 | Imai et al. | 257/627 |
| 5,656,832 | 8/1997 | Ohba et al. | 257/190 |
| 5,661,074 | 8/1997 | Tischler | 438/32 |

FOREIGN PATENT DOCUMENTS

| | | |
|---|---|---|
| 49-121478 | 11/1974 | Japan . |
| 51-126036 | 11/1976 | Japan . |
| 58-167766 | 10/1983 | Japan . |

OTHER PUBLICATIONS

Patent Abstracts of Japan, vol. 18. No. 570, Jul. 26, 1994 JP 06 209121A.

Kristall und Technik, vol. 12, No. 6 (1977), Preparation of InN Epitaxial Layers in $INCl_3$–$NH_2$ System, Marasina et al. pp. 541 to 545.

Nakamura et al., "InGaN Films Grown Under Different Carrier Gases by Metalorganic Chemical Vapour Deposition" vol. 93, No. 1, May 16–21, 1993, p. 2068.

Patent Abstracts of Japan, vol. 11, No. 300, Sep. 29, 1987, 62 091495A.

Fitzl et al., "Epitaxial Growth of GaN on {10.2} Oriented Sapphire in $GaCl/NH_3He$ and $GaCl/NH_3/H_2$ Systems" Kristall Und Technik, vol. 15, No. 10, 1980, pp.1143–1149.

Nikkei Science, Oct. 1994, pp. 44 to 55.

Kristall und Technik, vol. 12, No. 6 (1977), pp. 541 to 545, no month.

*Primary Examiner*—Brian Dutton
*Attorney, Agent, or Firm*—Smith, Gambrell & Russell; Beveridge, DeGrandi, Weilacher & Young

[57] ABSTRACT

A process for forming a high quality epitaxial compound semiconductor layer of indium gallium nitride $In_xGa_{1-x}N$, (where $0<x<1$) on a substrate. A first gas including indium trichloride ($InCl_3$) and a second gas including ammonia ($NH_3$) are introduced into a reaction chamber and heated at a first temperature. Indium nitride (InN) is grown epitaxially on the substrate by nitrogen ($N_2$) carrier gas to form an InN buffer layer. Thereafter, a third gas including hydrogen chloride (H1) and gallium (Ga) is introduced with the first and second gases into a chamber heated at a second temperature higher than the first temperature and an epitaxial $In_xGa_{1-x}N$ layer is grown on the buffer layer by $N_2$ gas. By using helium, instead of $N_2$, as carrier gas, the $In_xGa_{1-x}N$ layer with more homogeneous quality is obtained. In addition, the InN buffer layer is allowed to be modified into a GaN buffer layer.

6 Claims, 6 Drawing Sheets

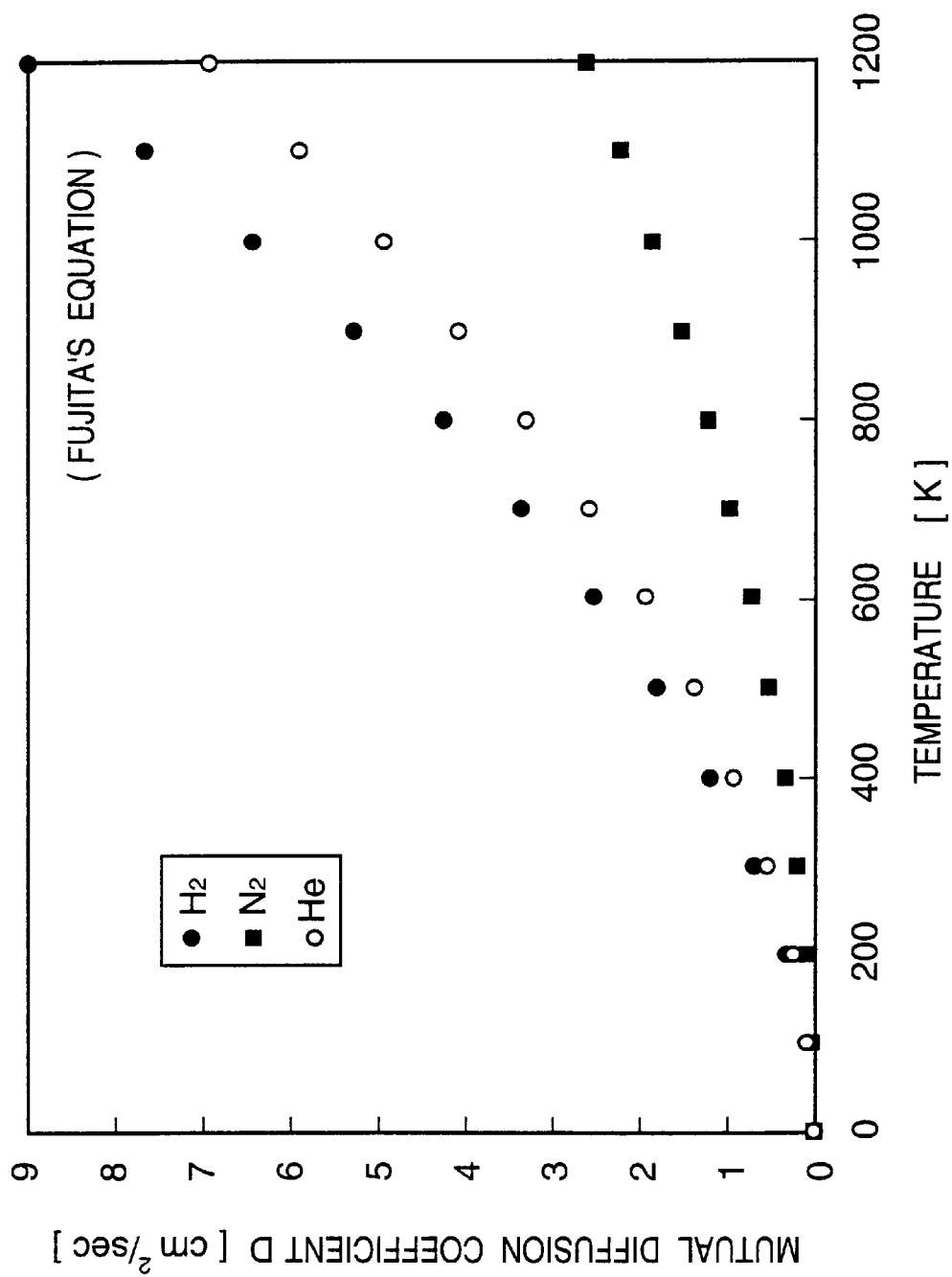

FIGURE 6A
N₂ CARRIER
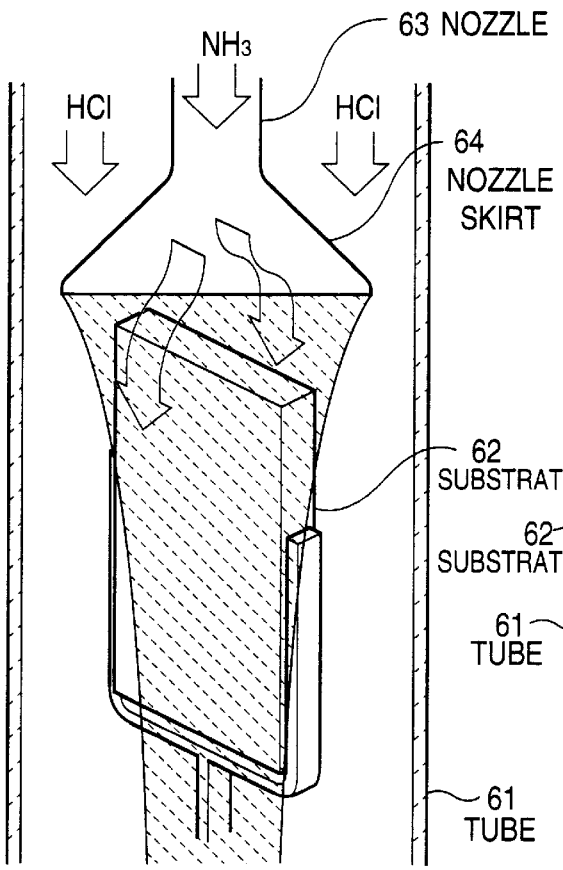
FIGURE 6B
He CARRIER
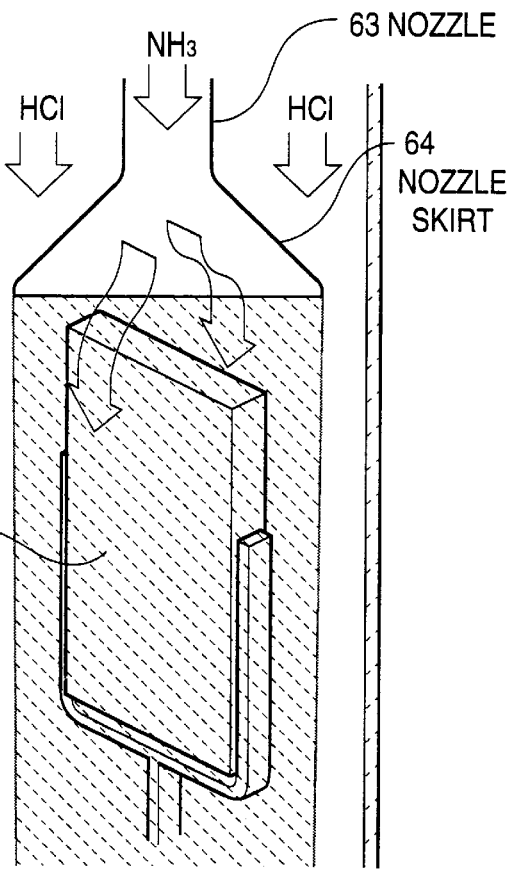
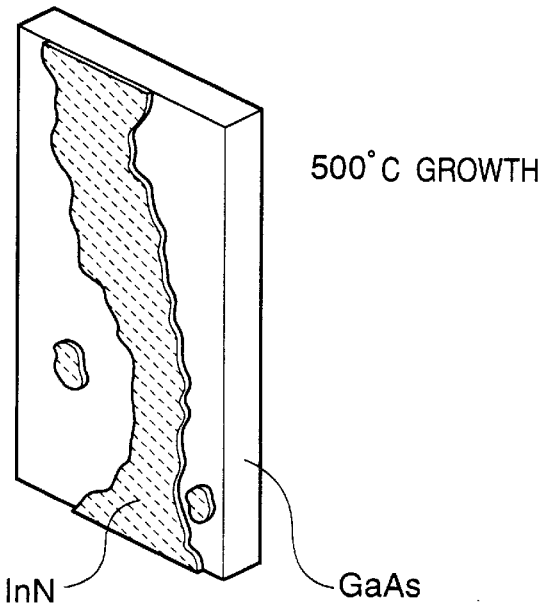
500°C GROWTH
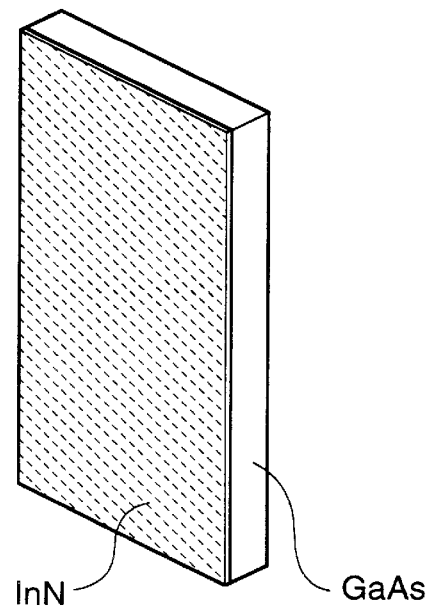

PROCESS FOR VAPOR PHASE EPITAXY OF COMPOUND SEMICONDUCTOR

BACKGROUND OF THE INVENTION

1. Field of the Invention

The present invention relates to a process for vapor phase epitaxy of a compound semiconductor, and particularly to a process for growing indium gallium nitride ($In_xGa_{1-x}N$, where, $0<x<1$) by vapor phase epitaxy.

2. Description of Related Art

In FIG. 1, there is shown a diagrammatic sectional view of a structure of a blue or green light emitting diode (LED) element of a type of gallium nitride (GaN) on a sapphire substrate, and such a structure is presently put on the market and described, for example, in "Nikkei Science" October 1994, page 44.

This blue or green LED element includes an epitaxial wafer comprising a sapphire substrate 11, a GaN buffer layer formed on the substrate 11, and a hexagonal GaN epitaxial layer 13 formed on the GaN buffer layer 12. The LED element further includes a clad layer 14, a light emitting layer 15, a clad layer 16 and GaN epitaxial layer 17 formed, in turn, on the wafer, and is also provided with ohmic electrodes 18 and 19. Furthermore, the GaN buffer layer 12 in the LED element is placed for decreasing defects by the differences of lattice constants between the sapphire substrate 11 and the GaN epitaxial layer 12.

In the above blue or green LED element, the substrate 11 is made of sapphire with an insulation property. When the electrodes 18 and 19 are formed on the element, it is also necessary for these electrodes to be formed on the same face side of the element. Therefore, forming the electrodes requires complex processes, for example, at least two patterning processes by photolithography and further an etching process by reactive ion etching.

Further, because hardness of sapphire is large, there is a problem that the sapphire substrates is difficult to be cut when separating into the individual elements. In an aspect of application of the LED element, furthermore, because sapphire cannot be cleaved, the element cannot be used as a laser diode which acts as an optical resonator with cleaved surfaces.

Thus, instead of sapphire with these drawbacks, conductive gallium arsenide (GaAs) is tried to be used as a substrate. Namely, it is studied for gallium nitride (GaN) to grow on a GaAs substrate by metal-organic chloride vapor phase epitaxy techniques, so-called "MOCVPE". This growth of GaN is sufficiently faster than growths by prior organometallic vapor phase epitaxy techniques, so-called "OMVPE".

Methods by MOCVPE techniques use, as raw materials, chlorides of elements in the third group of the element periodic table, and allow GaN to grow rapidly. The methods also allow growth of indium gallium nitride (InGaN) which provides an active layer of an LED element.

Further, it is desired to realize a pure blue wavelength LED element with high indium (In) mole fraction "x" of $In_xGa_{1-x}N$. However, as this In mole fraction "x" increases in $In_xGa_{1-x}N$, it is necessary to decrease a growth temperature on epitaxy. As a result, decreasing the temperature causes a problem that a growth rate of the epitaxy is slower.

Additionally, in "Kristall und Technik" Vol.12 No.6 (1977), pages 541 to 545, it is reported that chloride, namely indium trichloride ($InCl_3$), is used as an In source and ammonia ($NH_3$) is used as a nitride source, so that a hexagonal indium nitride (InN) crystal is grown on a sapphire substrate. However, the InN growth on a GaAs substrate is not examined Accordingly, cubic InN and InGaN adapted to manufacturing a laser diode are not obtained.

In the prior MOCVPE techniques that aluminium (Al), gallium (Ga) and indium (In) of elements in the third group of the element periodic table are provided as chlorides, a metal-organic raw material including one of the elements in the third group, for example, trimethylindium (TMIn: $C_3H_9In$) and trimethylgallium (TMGa: $C_3H_9Ga$), is provided together with hydrogen chloride (HCl). In the case of the former example, TMIn and HCl are composed into indium chloride (InCl) and the InCl is reacted with ammonia ($NH_3$) gas to grow InN and InGaN grown on a substrate, for example, a GaAs substrate.

However, these MOCVPE techniques lead to a slow growth rate on the substrate and cannot reproduce a certain composition of InGaN.

On the other hand, when vapor phase epitaxy (VPE) of compound semiconductor is performed, selection of atmosphere and carrier gasses is one of important key factors that strongly affect quality of the compound semiconductor to be formed.

For example, Japanese patent Laid-open Publication No.Showa (J-PA) 49-121478 (Hitachi) discloses a VPE technique that compound semiconductor is grown by vapor phase epitaxy with an inactive gas. Hydrogen ($H_2$) gas used before this technique has smaller specific gravity than raw material gasses and doping material gasses. The technique of Hitachi selects argon (Ar) gas which has a specific gravity close to raw material and doping material gasses, so that these raw material and doping material gasses are mixed uniformly to obtain uniformity of epitaxial layer and homogeneous impurity concentration.

Further, in Japanese patent Laid-open Publication No.Showa (JP-A) 51-126036 (Fujitsu), there is described another VPE process for growing a semiconductor crystal, which provides a carrier gas including an inactive gas with adjunctive hydrogen ($H_2$) gas less than 0.02 at volume ratio to the inactive gas. If only $H_2$ gas is used as a carrier gas, the $H_2$ gas reduces quartz ($SiO_2$) forming a wall of a reaction furnace to produce impurities of silicon (Si), and inhomogeneity of reacting gas concentration is caused chiefly by the difference of molecular weights between a raw material gas and the $H_2$ carrier, because the furnace has a structure of a horizontal type. In this process of Fujitsu, inactive gas, such as nitrogen ($N_2$) gas, argon (Ar) gas, etc., is used as a carrier gas for sending arsenic trichloride ($AsCl_3$) into the furnace, so that the inactive gas does not happen to react with the material of the wall at all, and an epitaxial layer of the crystal is allowed to grow rapidly and to be homogeneous.

In the process (Fujitsu), further, since the $H_2$ gas of a very small quantity is added adjunctively to the inactive carrier gas, crystal growth and impurity concentration are well controlled and maintained at certain levels. Namely, without the $H_2$ gas, $AsCl_3$ repeats thermal decomposition and recombination, according to the following reversible reactive equation (1), and as a result the crystal growth becomes remarkably unstable. But, with a very small mount of the adjunctive $H_2$ gas, an effective reaction, according to the further following reversible equation (2), and this reaction saturates at the volume ratio 0.02 of $H_2$ gas to the inactive gas:

$$4AsCl_3 \Leftrightarrow As_6 + 6Cl, \quad (1)$$

$$4AsCl_3 + 3H_2 \Leftrightarrow As_6 + 6HCl. \quad (2)$$

Furthermore, in Japanese patent Laid-open Publication No.Showa (JP-A) 58-167766 (Kogyogijutsu-in), there is described a VPE apparatus in which a raw material gas is introduced upwards from the bottom and discharged out of the top. If a raw material gas has heavier molecular weight than a carrier gas, there are problems that the raw material gas is distributed inhomogeneously in the carrier gas and thickness of a layer is also distributed inhomogeneously. In this apparatus of Kogyogijutsu-in, because a carrier gas such as nitrogen ($N_2$) gas, argon (Ar) gas, etc., is introduced upwards from the bottom, the inhomogeneous distribution of deposited layer on a substrate is improved.

SUMMARY OF THE INVENTION

Accordingly, an object of the present invention is mainly to resolve the above mentioned problems and to provide a process for vapor phase epitaxy of a compound semiconductor which process can make an epitaxial layer of indium gallium nitride ($In_xGa_{1-x}N$, where, $0<x<1$) with high quality and excellent homogeneity, by improving mixture of raw material gasses.

Another object of the present invention is especially to provide a process for vapor phase epitaxy of a compound semiconductor which process can make an epitaxial layer with high quality of indium gallium nitride ($In_xGa_{1-x}N$, where, $0<x<1$) with high quality, by providing a new raw material.

Another object of the present invention is particularly to provide a process for vapor phase epitaxy of a compound semiconductor which process can make an epitaxial layer of indium gallium nitride ($In_xGa_{1-x}N$, where, $0<x<1$) with higher quality, by using a carrier gas selected on the basis of a new view.

According to a first elementary feature of the present invention, there is provided a process for vapor phase epitaxy of a compound semiconductor indium gallium nitride $In_xGa_{1-x}N$ (where, $0<x<1$) wherein indium trichloride ($InCl_3$) is used as an indium (In) source.

In the process of the present invention, it is preferable that the above compound semiconductor $In_xGa_{1-x}N$ (where, $0<x<1$) is grown by vapor phase epitaxy on a conductive substrate which is made of least one material selected in a group of gallium arsenide (GaAs), gallium phosphide (GaP), indium arsenide (InAs), indium phosphide (InP) and silicon carbide (SiC).

Preferably, in the process of the present invention, inactive gas, such as nitrogen ($N_2$) gas, helium (He) gas, etc., is used as carrier gas for growing said compound semiconductor $In_xGa_{1-x}N$ (where, $0<x<1$) by vapor phase epitaxy.

According to a specified feature of the present invention, there is provided a process for vapor phase epitaxy of a compound semiconductor indium gallium nitride $In_xGa_{1-x}N$ (where, $0<x<1$) wherein;

a conductive substrate is placed in a reaction chamber, this conductive substrate being made of least one material selected in a group of gallium arsenide (GaAs), gallium phosphide (GaP), indium arsenide (InAs), indium phosphide (InP) and silicon carbide (SiC), a first gas including indium trichloride ($InCl_3$) as an indium source and a second gas including ammonia ($NH_3$) are introduced onto the substrate by a carrier gas of inactive gas, such as nitrogen ($N_2$) gas, helium (He) gas, etc., and a buffer layer of indium nitride (InN) is grown on the substrate by vapor phase epitaxy at a first temperature, while the reaction chamber is heated from the outside to maintain the first temperature, and, a third gas including hydrogen chloride (HCl) and organometallic raw material of gallium (Ga) is produced thereon together with the first and second gasses by the carrier gas and an epitaxial layer of said compound semiconductor $In_xGa_{1-x}N$ (where, $0<x<1$) is grown on the buffer layer by vapor phase epitaxy.

According to a second elementary feature of the present invention, there is provided a process for vapor phase epitaxy of a compound semiconductor indium gallium nitride $In_xGa_{1-x}N$ (where, $0<x<1$) wherein helium (He) is used as carrier gas for growing said compound semiconductor $In_xGa_{1-x}N$ (where, $0<x<1$) by vapor phase epitaxy.

According to another specified feature of the present invention, there is provided a process for vapor phase epitaxy of a compound semiconductor indium gallium nitride $In_xGa_{1-x}N$ (where, $0<x<1$) wherein;

a conductive substrate is placed in a reaction chamber, this conductive substrate being made of least one material selected in a group of gallium arsenide (GaAs), gallium phosphide (GaP), indium arsenide (InAs), indium phosphide (InP) and silicon carbide (SiC), a first gas including hydrogen chloride (HCl) and organometallic raw material of gallium (Ga) and a second gas including ammonia ($NH_3$) are introduced onto the substrate by hydrogen ($H_2$) carrier gas and a buffer layer of gallium nitride (GaN) is grown on the substrate by vapor phase epitaxy at a first temperature, while the reaction chamber is heated from the outside to maintain the first temperature, and, a third gas including indium trichloride ($InCl_3$) as an indium source is produced thereon together with the first and second gasses by helium (He) carrier gas and an epitaxial layer of said compound semiconductor $In_xGa_{1-x}N$ (where, $0<x<1$) is grown on the buffer layer by vapor phase epitaxy.

The above and other objects, features and advantages of the present invention will be apparent from the following description of preferred embodiments of the present invention with reference to the accompanying drawings.

BRIEF DESCRIPTION OF THE DRAWINGS

FIG. 5 is a graph which illustrates calculated data of mutual diffusion coefficient characteristics between carrier gasses and HCl gas, FIGS. 6A and 6B show examples of gas flows and grown InN layer when $N_2$ and He gasses are used as carrier gas, and, FIG. 7 shows another example of structures including an epitaxial compound semiconductor layer according to the present invention.

DETAILED EXPLANATION OF THE INVENTION (Selection of Raw Material)

As above mentioned, in MOCVPE (metal-organic chloride vapor phase epitaxy) techniques in the prior art, if indium chloride InCl is used as an indium source, growth temperature is limited to a narrow range, so as to grow well and obtain an epitaxial layer of a type of indium gallium nitride (In Ga N) with high quality.

In this case, because using InCl as an indium source leads to narrow the range of the growth temperature for growing indium nitride (InN) and it is necessary to lower the growth temperature, the growth rate is decreased to one hundredth of that in the case of gallium nitride (GaN).

Thus, the Inventors have compared the reaction analysis results in a first case of InCl and ammonia ($NH_3$) with those in a second case of indium trichloride ($InCl_3$) and $NH_3$. As a result, it has been found out that, in the second case, the growth rate is far faster than the growth rate in the first case, because the reactive quantity in the second case is one hundred times that in the first case. In the second case, when hydrogen ($H_2$) gas is used as carrier gas, the reactive quantity is decreased, but when inactive gas, such as nitrogen ($N_2$) gas, helium (He) gas, etc., is used as carrier gas, the reactive quantity is sufficient to maintain well the fast growth.

Though the material $InCl_3$ is in solid state at ordinary temperature, heating it to about 350° C. allows to obtain a vapor pressure for epitaxy. Therefore, in the process for vapor phase epitaxy according to the present invention, $InCl_3$ is used as an indium source and inactive gas is used as carrier gas.

Using $InCl_3$ is effective in both epitaxial growth of an InN buffer layer on a substrate and an InGaN layer on the InN buffer layer, as described in following embodiment. Accordingly, the material $InCl_3$ in vapor phase epitaxy is effective in epitaxial growth, independent of the substrate and the buffer layer, and capable of well growing InGaN.

Additionally, though the substrate is made of gallium arsenide (GaAs) in the embodiments, it is also allowed for the substrate to be made the other suitable materials for example, gallium phosphide (GaP), indium arsenide (InAs), indium phosphide (InP) and silicon carbide (SiC). Further, though $N_2$ gas is used as carrier gas in first embodiment, it is also allowed for any other suitable gas to be used effectively as carrier gas, for example, helium (He) gas, and the other inactive gas. Especially, effectiveness of He gas is described hereinafter.

Furthermore, as similarly as the above, in the following embodiments, it is effectual that the first temperature for InN is approximately between 300° C. and 500° C. and the second temperature for InGaN is more than 800° C.

(First Embodiment)

Figure 2:
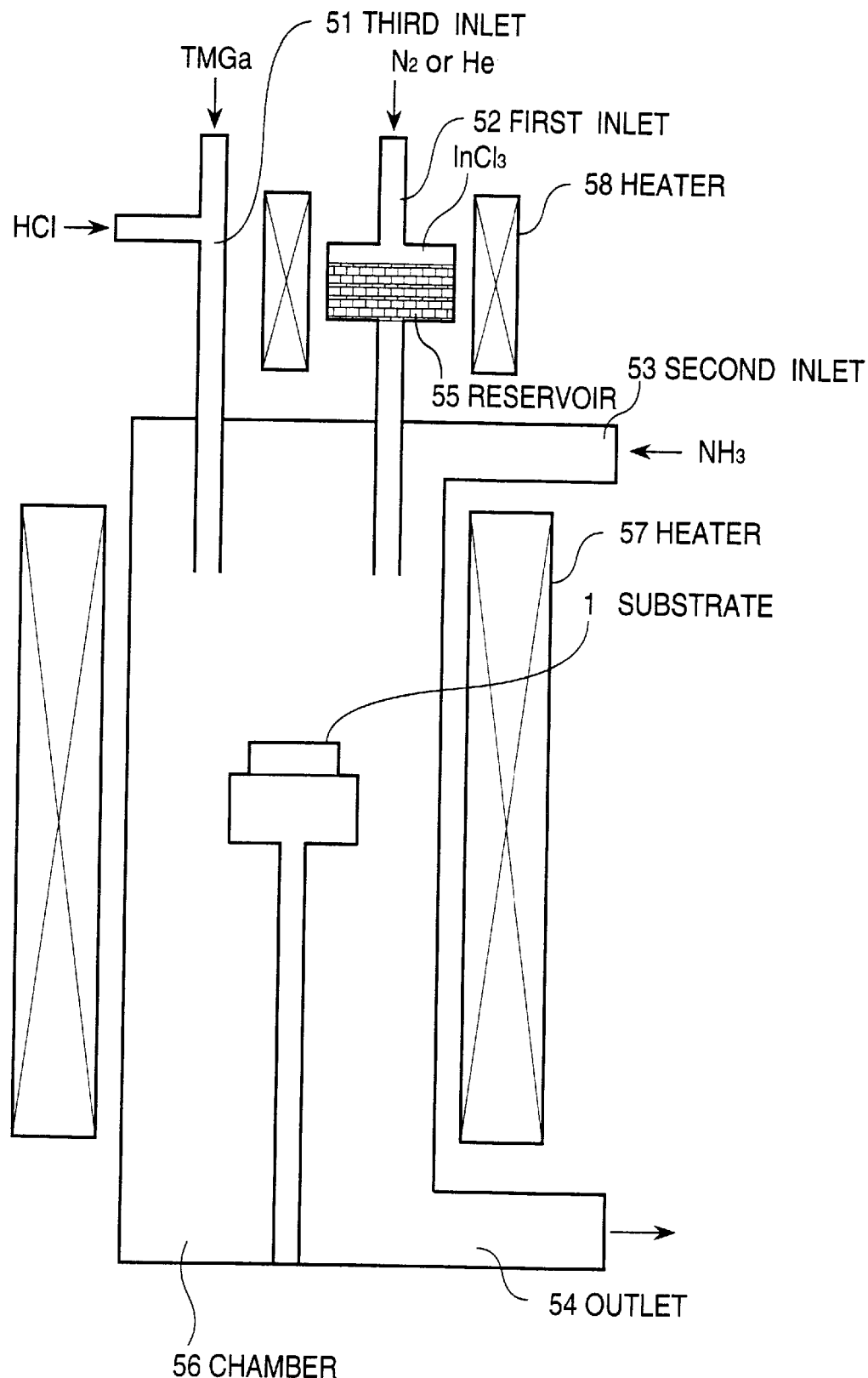
FIG. 2 shows roughly a VPE apparatus used to examine a process for making an epitaxial layer of a compound semiconductor according to the present invention.

Referring to FIG. 2, there is shown roughly a VPE apparatus used to examine a process for making an epitaxial layer of a compound semiconductor according to the present invention. This VPE apparatus is provided with a first gas inlet 52, a second gas inlet 53, a third gas inlet 51, a gas outlet 54, a reservoir 55 containing indium trichloride ($InCl_3$) as an indium source which is an element in the third group of the element periodic table, a reaction chamber 56, a resistance heater 57 for heating, from outside, the whole chamber 56 and the inside, and another ohmic-resistance heater 58 for heating the reservoir 55 to control vapor pressure of $InCl_3$.

According to first elementary feature of the present invention, in the first embodiment, vapor phase epitaxy is examined as follows.

At first, after a substrate 1 of (100) GaAs is pre-treated by ordinary etchant of a type of sulfuric acid ($H_2SO_4$), the substrate 1 is placed within the chamber 56. Then, the whole chamber 56 and the inside is heated from the outside to be maintained at a first temperature, for example, 400° C., and the reservoir 55 is heated to a suitable temperature, for example, 350° C.

In these temperature conditions, carrier gas of nitrogen ($N_2$) from the first inlet 52 is introduced through the heated reservoir 55.

Accordingly, $InCl_3$ is introduced into the chamber 56 at partial pressure of $1 \times 10^{-4}$ atm. On the other hand, from the second inlet 53, there is introduced ammonia ($NH_3$) gas, at partial pressure of $3 \times 10^{-1}$ atm, as a raw material for nitrogen ($N_2$) which is an element in the fifth group of the table. The partial pressures of these gasses of $InCl_3$ and $NH_3$ are controlled by saturation vapor pressures from gas temperatures and by quantities of gas flows.

Under these conditions, epitaxial growth is done for 30 minutes and as a result there is formed a buffer layer 2 of indium nitride (InN) having thickness of 30 nm, as shown in FIG. 2.

After above mentioned steps, the substrate 1 with the buffer layer 2 of InN is heated by the resistance heater 57 to a second temperature, for example, 400° C. Thereafter, in this temperature, trimethylgallium (TMGa: $C_3H_9Ga$) and hydrogen chloride (HCl) are introduced with $N_2$ carrier gas from the third inlet 51, in addition to $InCl_3$ and $NH_3$. Then, under the condition that the partial vapor pressures of $InCl_3$, TMGa, HCl and $NH_3$ are $5 \times 10^{-3}$ atm, $1 \times 10^{-4}$ atm, $1 \times 10^{-4}$ atm and $3 \times 10^{-1}$ atm, respectively, epitaxial growth is done for 60 minutes.

As a result, there is formed, on the buffer layer 2, an epitaxial layer 3 of indium gallium nitride ($In_xGa_{1-x}N$) having thickness of 1 μm and a mirror surface, as shown in FIG. 2. As a result of measurement by X-ray diffraction, it is seen that the layer 3 consists of cubic $In_xGa_{1-x}N$ (where, x=0.5) which is adapted to making a laser diode, namely adapted to cleavage for acting as an optical resonator. Indeed, this diffraction result is distinguished from the X-ray diffraction of hexagonal system.

Therefore, the buffer layer 2 lying between the GaAs substrate 1 and the $In_xGa_{1-x}N$ epitaxial layer 3 allows to advance crystalline qualities.

(Selection of Carrier Gas)

In order to confirm difference between growths of InGaN epitaxial layers by different carrier gasses, it is tried to grow InGaN by hydrogen ($H_2$) gas used ordinarily as carrier gas.

Namely, the buffer layer 2 is formed under the same conditions to the above embodiment, and then, when it is tried to grow an epitaxial layer 3, $H_2$ gas is used, instead of $N_2$ gas, only for carrier gas. As a result, it is not recognized to form any InGaN epitaxial layer 3.

Thus, in order to grow a compound semiconductor indium gallium nitride ($In_xGa_{1-x}N$, where 0<x<1) with a certain quality by vapor phase epitaxy, it is necessary to use indium trichloride ($InCl_3$) as an indium source as well as to use inactive gas, such as nitrogen ($N_2$) gas, etc., as carrier gas.

In brief, indium trichloride ($InCl_3$) has possible reactions indicated the following equations (3) and (4):

$$InCl_3 + NH_3 \rightarrow InN + 3\ HCl \qquad (3),$$

$$InCl_3 + H_2 \rightarrow InCl + 2\ HCl \qquad (4).$$

In the other word, $H_2$ carrier gas is unnecessary for desired reaction, as shown in the equation (4), and may give ill effects by occurring the decomposition of $InCl_3$. Therefore, especially in the case that indium trichloride is used as a raw material, it is preferable to use inactive carrier gas without reactiveness. Thus, $N_2$ gas is used as carrier gas because $N_2$ gas is the cheapest in the inactive gasses.

However, $N_2$ gas has a small diffusion coefficient, and accordingly is insufficient to be mixed with raw material gasses, such as $InCl_3$, TMGa, HCl, $NH_3$, etc. Therefore, this mixture insufficiency of the raw material gasses cause the distribution of gas concentrations to bias or vary largely, so that an InN buffer layer is grown inhomogeneously on a substrate and an $In_xGa_{1-x}N$ epitaxial layer is also grown inhomogeneously on the the buffer layer. As a result, composition and thickness of the $In_xGa_{1-x}N$ layer happens to be inhomogeneous.

In order to resolve this problem, according to the second elementary feature of the present invention, helium (He) gas is used as carrier gas for growing indium gallium nitride ($In_xGa_{1-x}N$) by vapor phase epitaxy. This He carrier gas is adapted to grow an $In_xGa_{1-x}N$ layer on a conductive substrate of such as gallium arsenide (GaAs), etc., together with various raw material gasses for components, i.e., indium (In), gallium (Ga) and nitrogen (N), of $In_xGa_{1-x}N$. In particular, the He carrier gas is preferably adaptable for growth by indium trichloride ($InCl_3$) as an indium source.

There is known "Fujita's Equation" which is one of equations for calculating gas mutual diffusion coefficient. According to this equation, as well known, if two vapor phases "a" and "b" have critical temperatures "Tca" and "Tcb" [K], critical pressures "Pca" and "Pcb" [atm] and molecular weights "Ma" and "Mb", mutual diffusion coefficient "Dab" at temperature "T" is shown by the following equation (5):

$$Dab = 0.00070 \times T^{1.838}/[(Tca/Pca)^{1/3}+(Tcb/Pcb)^{1/3}]^2 \times (1/Ma+1/Mb)^{1/2} \quad (5).$$

Figure 4:
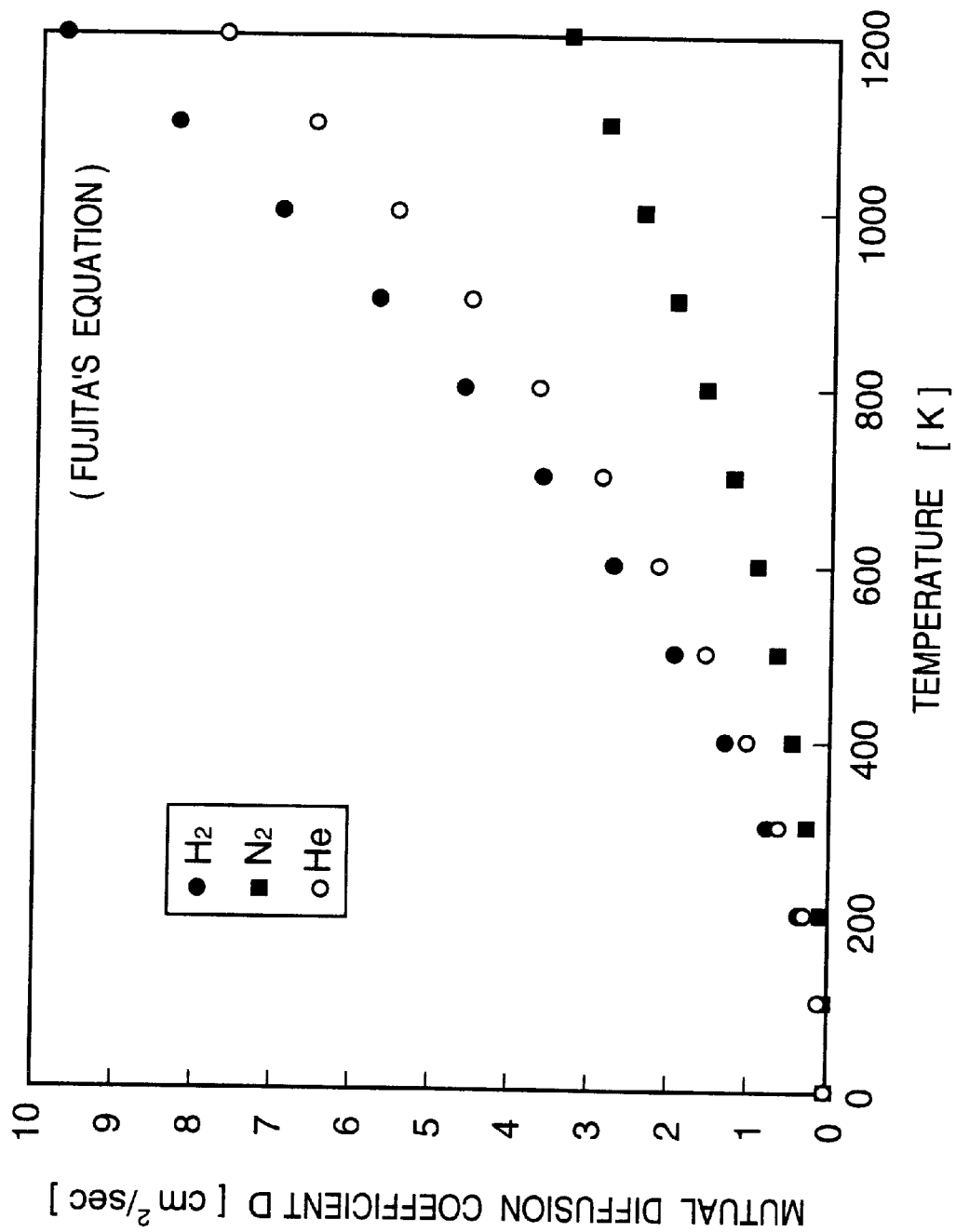
FIG. 4 is a graph which illustrates calculated data of mutual diffusion coefficient characteristics between carrier gasses and $NH_3$ gas.

Thus, mutual diffusion coefficients between three carrier gasses of $H_2$, $N_2$ and He and raw material gasses, for example $NH_3$ gas and HCl gas, are found to be shown in FIGS. 4 and 5. From these characteristics, the mutual diffusion coefficients between the carrier gasses and the raw material gasses are placed as $H_2 > He > N_2$ in descending order, and it is found that these coefficients between $NH_3$ gas and the carrier gasses at 800° C. are 7.91 [cm²/sec] for $H_2$, 6.27 [cm²/sec] for He, and, 2.71 [cm²/sec] for $N_2$, as shown in FIG. 4, respectively. Therefore, it is understood that the coefficients between $NH_3$ gas and He carrier gas are more than two times the coefficients between $NH_3$ gas and $N_2$ carrier gas.

If $N_2$ gas is used as carrier gas, as the first embodiment, chiefly because the coefficients of the $N_2$ carrier gas are considerably small, the carrier gas is sufficiently mixed with the raw material gasses such as $NH_3$ and accordingly the epitaxial layer happens to have ununiform thickness and inhomogeneous composition.

On the other hand, the coefficients of He gas are equal to approximately 2.3 times those of $N_2$ gas and close to those of $H_2$ gas. Thus, it is found out that using He gas as carrier gas allows to mix sufficiently the raw material gasses, to grow homogeneously and to improve homogeneous qualities of composition and thickness of the $In_xGa_{1-x}N$ epitaxial layer.

The Inventors have practically examined by means of experiment visualizing a gas flow in a reaction apparatus, as shown on the upper stages in FIGS. 6A and 6B, in order to confirm mixing condition of these $N_2$ and He carrier gasses. In this visualization experiment, there are placed a simulated substrate 62 and a nozzle 63 with a skirt 64 within a transparent tube 61, such as quartz glass. Ammonia ($NH_3$) gas is introduced from the inside of the nozzle 63, hydrogen chloride (HCl) gas is introduced from the outside of the nozzle 63 towards the substrate 62, and both of these gasses flow simultaneously together with He or $N_2$ carrier gas.

These $NH_3$ and HCl gasses introduced in the experiment apparatus are mixed each other at an ambient room temperature below the nozzle skirt 64 which is widened in a form of a trumpet to react according to the following equation (6):

Namely, in the reaction by the above equation (6), there is produced white particulates of ammonium chloride ($NH_4Cl$) in a region shown by slanting broken lines on the upper stages in FIGS. 6A and 6B, and these white particulates appear visually with a pattern reflecting the flow of mixed gasses of $NH_3$ and HCl. Accordingly, the gas flow is confirmed visually with naked eye.

On the upper stages in FIGS. 6A and 6B, as a result of the above visualization experiment, there are shown examples of mixed gas flows traced according to patterns observed when $NH_3$ and HCl.gasses are introduced in the tube 61 at the room temperature. In the case when $N_2$ gas is used as a carrier gas (A), $NH_3$ and HCl are not diffused and mixed sufficiently each other, so that the gas flow is inhomogeneous, as shown on the upper stage in FIG. 6A. On the other hand, in the case when He gas is used as a carrier gas (B), $NH_3$ and HCl are diffused and mixed sufficiently each other, so that the gas flow is homogeneous, as shown on the upper stage in FIG. 6B.

Next, the Inventors have actually experimented with indium nitrogen (InN) growing by acting the tube 61 as a reaction chamber for the epitaxy. In this experiment, as an example,.a gallium arsenide (GaAs) substrate is placed within the tube 61, towards this substrate, $NH_3$ gas from the inside of the nozzle 63 and indium trichloride ($InCl_3$) gas from the outside of the nozzle 63 are introduced, both of these gasses flow simultaneously together with He or $N_2$ carrier gas, and the substrate is heated to 500° C. to grow indium nitride (InN) at 500° C.

On the lower stages in FIGS. 6A and 6B, as a result of the above epitaxy experiment, there are shown examples of InN layers formed when $NH_3$ and $InCl_3$.gasses as raw materials are introduced in the tube 61 at 500° C. In the case when $N_2$ gas is used as a carrier gas (A), InN layer grows only partially and is inhomogeneous, as shown on the lower stage in FIG. 6A. On the other hand, in the case when He gas is used as a carrier gas (B), it is confirmed that InN layer grows homogeneously, as shown on the upper stage in FIG. 6B. Therefore, in the case of He carrier gas (B), the concentration of the raw materials is distributed homogeneously to improve homogeneity of the epitaxial growth.

In addition, employment of He carrier gas leads to a problem that He gas is more expensive than $N_2$ gas. However, in the case of the raw material of indium trichloride ($InCl_3$), increasing of the cost is suppressed to the minimum, because growth period for epitaxial growth is short and He carrier gas is used only for $In_xGa_{1-x}N$ growth.

(Second Embodiment)

According to the second elementary feature of the present invention, helium (He) gas is used as carrier gas when compound semiconductor indium gallium nitride ($In_xGa_{1-x}N$, where, 0<x<1) is to be grown epitaxially on conductive compound semiconductor substrate, on the basis of the above mentioned confirmation of homogeneous concentration of raw materials by He carrier gas. It is generally allowed for an InGaN layer to grow well only by using He carrier gas instead of nitrogen ($N_2$) carrier gas in the first embodiment. But, in a second preferable embodiment explained hereinafter, it is allowed for an $In_xGa_{1-x}N$ layer to grow more homogeneously by improving a first step of forming a buffer layer.

Figure 1:
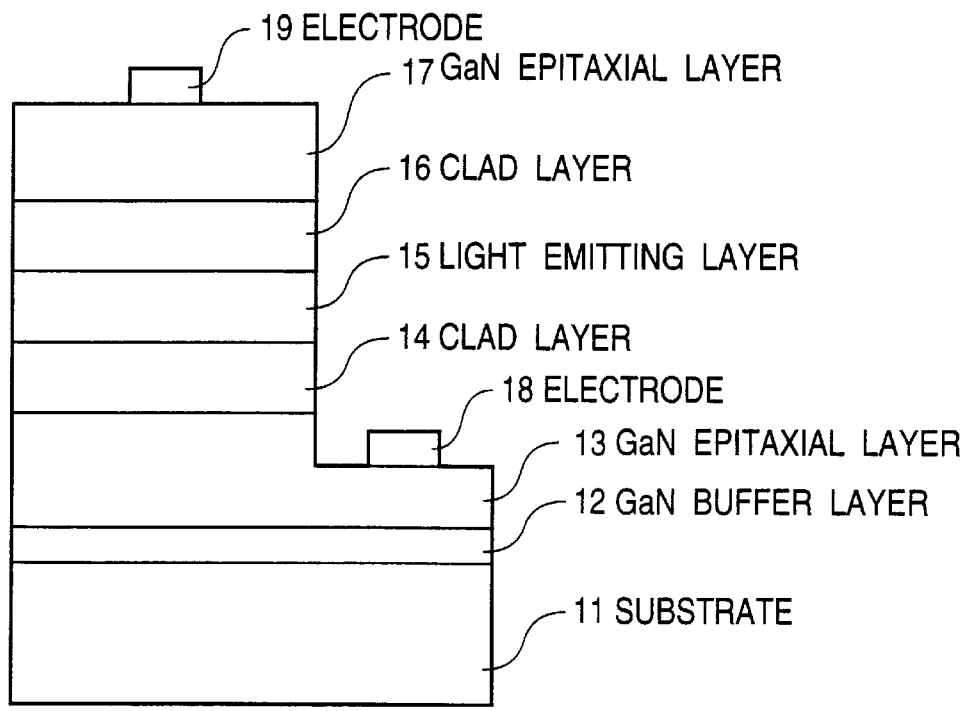
FIG. 1, as explained hereinbefore, shows a diagrammatic sectional view of a structure of a blue or green light emitting diode (LED) element in the prior art.
Figure 3:
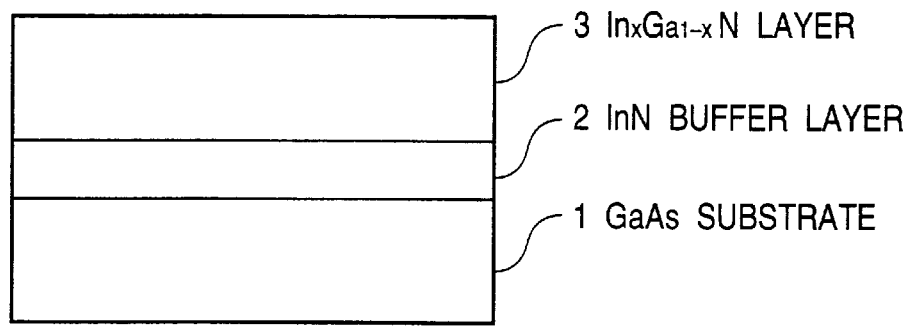
FIG. 3 shows an example of structures including an epitaxial compound semiconductor layer according to the present invention.
Figure 7:
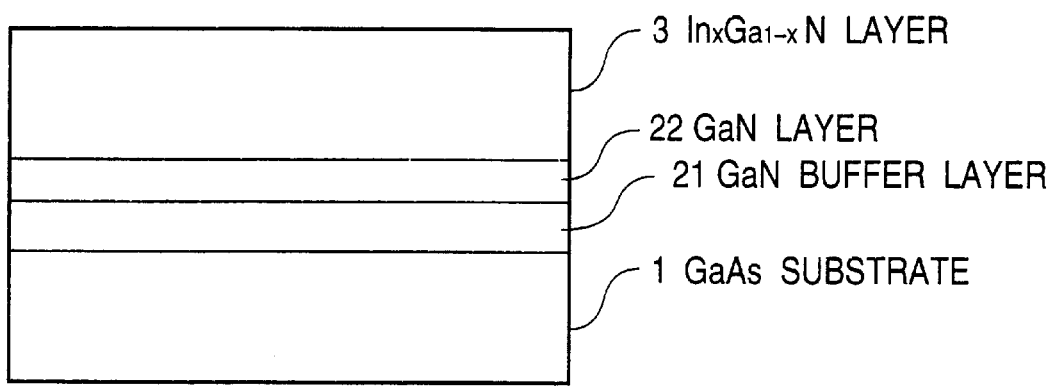

In the second embodiment, the VPE apparatus shown in FIG. 1 is also used as an apparatus for epitaxial growth. And, as shown in FIG. 7, after a gallium nitride (GaN) buffer layer 21 is grown on a conductive substrate 1 made of gallium arsenide (GaAs) with the plane A (100) in the VPE apparatus, a GaN layer 22 is grown on this buffer layer 21. Finally, an $In_xGa_{1-x}N$ (where, 0<x<1) layer 3 is further grown epitaxially. In this second embodiment, hydrogen ($H_2$) gas is used as a carrier gas when the buffer layer 21 and the GaN layer 22 are grown.

At first, the GaAs substrate 1 is placed in the reaction chamber and the substrate 1 is heated to the first temperature, for example, 500 ° C. In this temperature condition, $H_2$ gas as a carrier and ammonia ($NH_3$), trimethylgallium (TMGa; $C_3H_9Ga$) and hydrogen chloride (HCl) gasses as raw materials are introduced into the chamber 56 to grow epitaxially gallium nitride (GaN) on the substrate 1 and to form a GaN buffer layer 21.

Next, after the GaN buffer layer 21 is formed, for a while introduction of $NH_3$, TMGa and HCl is stopped and the substrate 1 is heated up to a relative high temperature, for example, 1,000° C. In this temperature condition, $H_2$ carrier gas and $NH_3$, TMGa and HCl gasses are introduced into the chamber 56 again to grow epitaxially GaN on the substrate 1 and to form a GaN layer 22. Helium (He) gas can be also used instead of $H_2$ gas as a carrier gas, when the buffer layer 21 and the GaN layer 22.

Finally, after the GaN layer 22 is formed, for a while introduction of $NH_3$, TMGa and HCl is stopped and the substrate 1 is heated down to a second temperature, for example, 800° C. In this temperature condition, carrier gas is changed to He gas and indium trichloride ($InCl_3$) vapor from the reservoir 55 is also introduced in addition to $NH_3$, TMGa and HCl gasses into the chamber 56 to grow epitaxially InGaN on the substrate 1 for 30 minutes. As a result, there is formed, on the GaN layer 22, an epitaxial layer 3 of indium gallium nitride ($In_xGa_{1-x}N$) having thickness of 2 $\mu$m and a mirror surface, as shown in FIG. 7. As a result of measurement by X-ray diffraction, it is observed that the layer 3 has a X-ray diffraction peak of hexagonal $In_xGa_{1-x}N$ (where, x=0.2), and it is confirmed that the $In_xGa_{1-x}N$ layer 3 has more homogeneous composition and thickness.

As the above mentioned, according to the present invention, using indium trichloride ($InCl_3$) as an indium source allows to grow a high quality epitaxial layer of indium gallium nitride ($In_xGa_{1-x}N$) at a practical growth rate. Inactive gasses, such as nitrogen ($N_2$) gas easy to deal, helium (He) gas, etc., are allowed to be used as a carrier gas when $In_xGa_{1-x}N$ epitaxial layer is to be formed. Especially, He carrier gas allows to improve further the homogeneous qualities of composition and thickness of the $In_xGa_{1-x}N$ epitaxial layer and to provide still more homogeneous $In_xGa_{1-x}N$ epitaxial layer.

We claim:

1. A process for forming an epitaxial compound semiconductor indium gallium nitride $In_xGa_{1-x}N$, where 0<x<1 on a substrate comprising contacting said substrate with indium trichloride in the gaseous phase.

2. The process according to claim 1 further comprising forming said compound semiconductor $In_xGa_{1-x}N$ by vapor phase epitaxy on a conductive substrate which is made of least one material selected from the group consisting of gallium arsenide, gallium phosphide, indium arsenide, indium phosphide and silicon carbide.

3. The process according to claim 1 wherein an inert gas is used as carrier gas for growing said compound semiconductor $In_xGa_{1-x}N$ by vapor phase epitaxy.

4. The process according to claim 1 comprising placing a conductive substrate in a reaction chamber, the conductive substrate being made of least one material selected from the group consisting of gallium arsenide, gallium phosphide, indium arsenide, indium phosphide and silicon carbide, introducing a first gas including indium trichloride as an indium source and a second gas including ammonia onto the substrate by a carrier gas of inactive gas, and growing a buffer layer of indium nitride on the substrate by vapor phase epitaxy at a first temperature, while heating the reaction chamber from the outside to maintain the first temperature, and, introducing a third gas including hydrogen chloride and organometallic raw material of gallium with the first and second gases and the carrier gas and growing an epitaxial layer of said compound semiconductor $In_xGa_{1-x}N$ on the buffer layer by vapor phase epitaxy.

5. The process according to claim 1 wherein helium is used as the carrier gas.

6. A process for forming an epitaxial compound semiconductor indium gallium nitride $In_xGa_{1-x}N$, where 0<x<1 comprising:

placing a conductive substrate in a reaction chamber, the conductive substrate being made of least one material selected from the group consisting of gallium arsenide, gallium phosphide, indium arsenide, indium phosphide and silicon carbide, introducing a first gas including hydrogen chloride and organometallic raw material of gallium and a second gas including ammonia onto the substrate by hydrogen carrier gas and growing a buffer layer of gallium nitride on the substrate by vapor phase epitaxy at a first temperature, while heating the reaction chamber from the outside to maintain the first temperature, and, introducing a third gas including indium trichloride as an indium source together with the first and second gases by helium carrier gas and growing an epitaxial layer of said compound semiconductor $In_xGa_{1-x}N$ on the buffer layer by vapor phase epitaxy.

* * * * *